(12) United States Patent
Westphal

(10) Patent No.: US 7,514,928 B2
(45) Date of Patent: Apr. 7, 2009

(54) SUPERCONDUCTING MAGNET CONFIGURATION WITH REDUCED HEAT INPUT IN THE LOW TEMPERATURE REGIONS

(75) Inventor: Michael Westphal, Offenbach (DE)

(73) Assignee: Bruker Biospin GmbH, Rheinstetten (DE)

(*) Notice: Subject to any disclaimer, the term of this patent is extended or adjusted under 35 U.S.C. 154(b) by 41 days.

(21) Appl. No.: 11/783,762

(22) Filed: Apr. 12, 2007

(65) Prior Publication Data

US 2008/0157771 A1 Jul. 3, 2008

(30) Foreign Application Priority Data

Apr. 21, 2006 (DE) .................. 10 2006 018 650

(51) Int. Cl.
*G01V 3/00* (2006.01)
(52) U.S. Cl. ........................................ 324/319; 324/320
(58) Field of Classification Search ................ 324/319, 324/320; 335/216
See application file for complete search history.

(56) References Cited

U.S. PATENT DOCUMENTS

| | | | |
|---|---|---|---|
| 5,113,166 A | 5/1992 | Miyajima | |
| 5,235,283 A * | 8/1993 | Lehne et al. ................. 324/318 |
| 6,501,275 B1 | 12/2002 | Westphal | |
| 6,667,619 B2 * | 12/2003 | Westphal et al. ............ 324/318 |
| 6,707,302 B2 | 3/2004 | Ries | |
| 2003/0006773 A1 * | 1/2003 | Ries ............................ 324/318 |
| 2005/0110602 A1 | 5/2005 | Westphal | |

FOREIGN PATENT DOCUMENTS

| | | |
|---|---|---|
| DE | 39 00 725 | 7/1990 |
| JP | 31 29 784 | 6/1991 |
| WO | WO 90/08329 | 7/1990 |

* cited by examiner

*Primary Examiner*—Louis M Arana
(74) *Attorney, Agent, or Firm*—Paul Vincent

(57) ABSTRACT

The invention concerns a magnet configuration comprising a superconducting magnet coil (1) within which a gradient system is to be switched. All low temperature oscillation systems (R1) with a temperature T1<10K within the magnet coil (1) are produced from a material having good electrical conducting properties, and at least one warm oscillation system (R2) with a temperature T2>10K within the magnet coil (1) has worse electrical conducting properties and has a considerably different mechanical resonance frequency (separation approximately 500 Hz or more) than at least one of the low temperature oscillation systems (R1). This reduces the undesired heating power supplied to the low temperature oscillation systems due to mechanical oscillations and induced eddy currents.

28 Claims, 8 Drawing Sheets

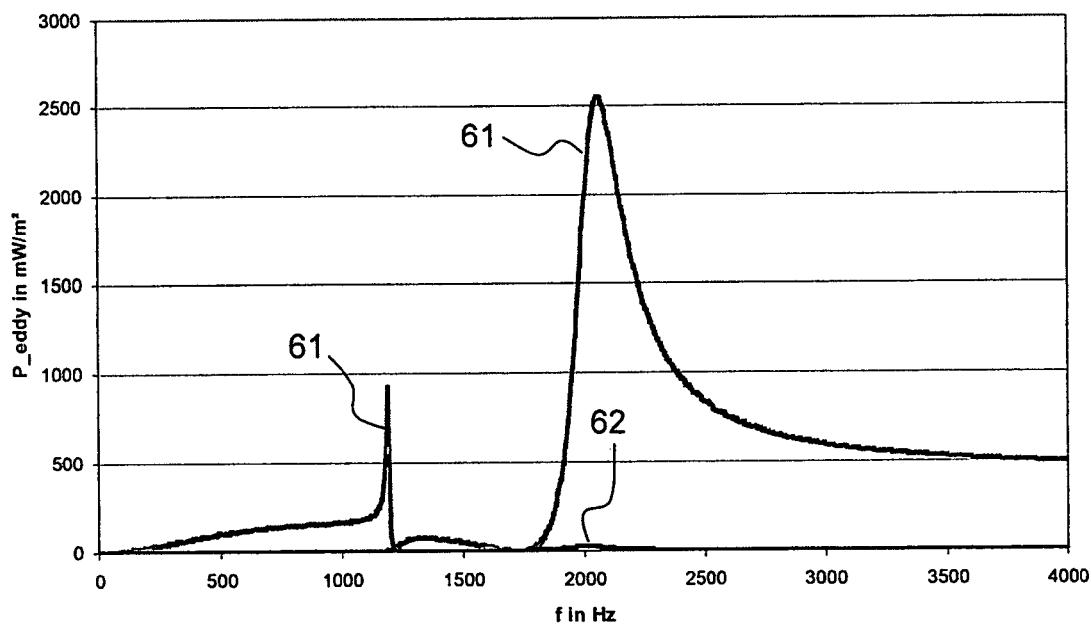
Fig. 6a
Fig. 6b
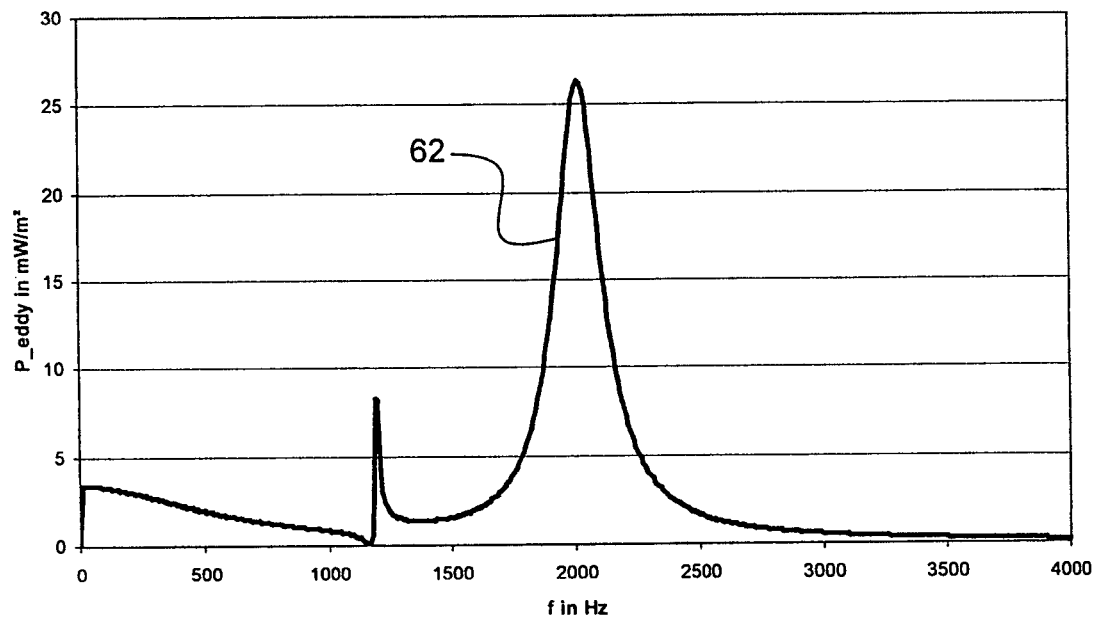

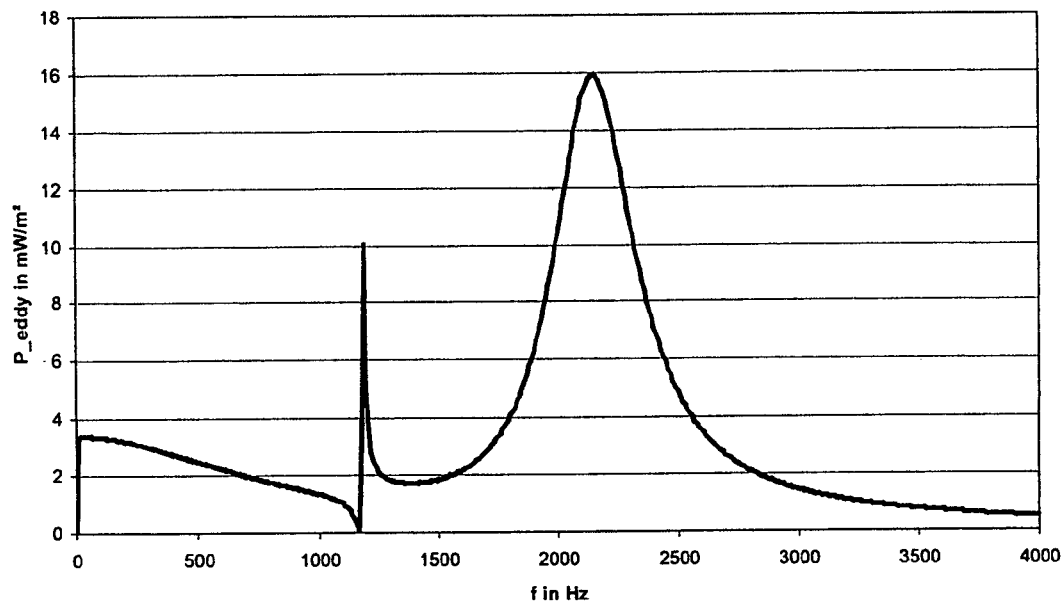
Fig. 7
Fig. 8
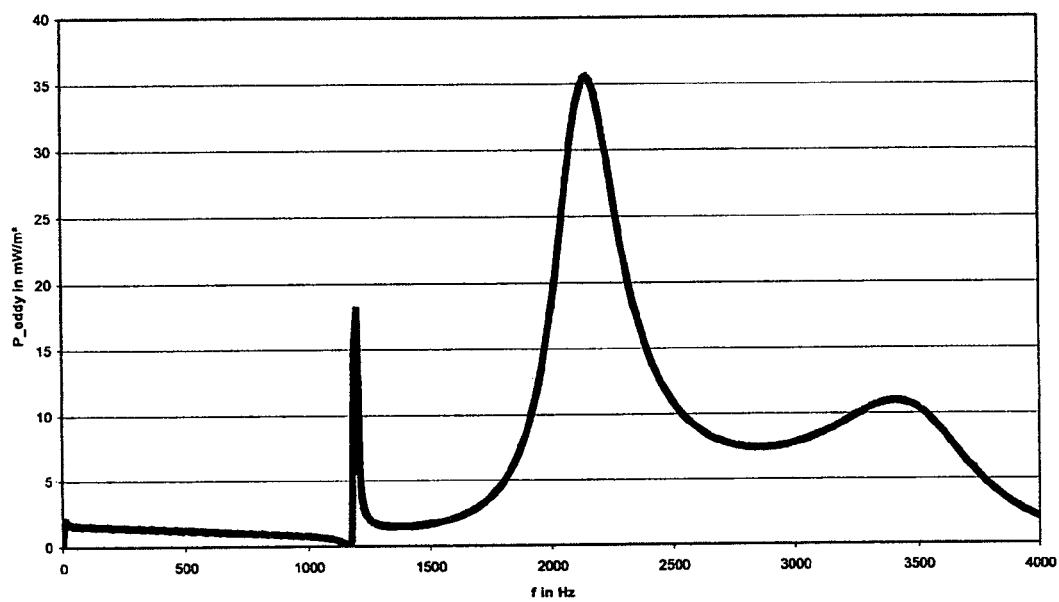

SUPERCONDUCTING MAGNET CONFIGURATION WITH REDUCED HEAT INPUT IN THE LOW TEMPERATURE REGIONS

This application claims Paris Convention priority of DE 10 2006 018 650.8 filed Apr. 21, 2006 the complete disclosure of which is hereby incorporated by reference.

BACKGROUND OF THE INVENTION

The invention concerns a superconducting magnet configuration for a magnetic resonance apparatus, comprising:

a substantially cylindrical magnet coil with a magnet winding of superconducting wire for generating a magnetic field B in a working volume;

a room temperature bore which is coaxial to the magnet coil and contains the working volume; and several electrically conducting oscillation systems (R1, R2, R2') which are disposed radially inside the magnet winding of the magnet coil, wherein each oscillation system (R1, R2, R2') has a uniform oscillation behavior and can oscillate relative to any other oscillation system, wherein each oscillation system (R1, R2, R2') is substantially tubular and disposed coaxially to the room temperature bore, wherein each oscillation system (R1, R2, R2') has an electrical conductivity value $p=\sigma*d$ with $p>1*10^2$ 1/Ohm at room temperature, with $\sigma$: electric conductivity of the oscillation system and d: minimum wall thickness of the oscillation system in the radial direction, wherein each oscillation system (R1, R2, R2') has a characteristic mechanical value $q=E/\rho$, with E: average modulus of elasticity of the oscillation system and $\rho$: average density of the oscillation system, wherein a low temperature oscillation system (R1) or several low temperature oscillation systems are provided which have temperatures of T1<10K during operation, and wherein a warm oscillation system (R2) or several warm oscillation systems (R2, R2') are provided which have temperatures of T2>10K during operation.

A superconducting magnet configuration of this type is disclosed in DE 101 27 822 A1.

Superconducting magnet configurations are used to generate strong magnetic fields in a working volume. Strong magnetic fields are required, in particular, in nuclear magnetic resonance (NMR) spectroscopy and NMR tomography (MRT) to perform high-quality measurements.

The strong magnetic fields are thereby generated by a magnet coil which is wound from superconducting wire. The magnet coil typically comprises several sections and portions of partially different superconducting materials. The superconducting materials used in the magnet coil are cooled below the transition temperature such that large electric currents and magnetic field strengths can be produced by the magnet coil in this superconducting state. It is cooled e.g. by surrounding liquid helium or by refrigerators which are in thermal contact with the magnet coil.

In NMR experiments, additional fields are added to the strong magnetic field of the magnet coil. These so-called gradient fields are used to encode signals (e.g. local encoding) and are generated by a gradient coil. The gradient coil is usually positioned in the room temperature bore of the superconducting magnet configuration close to the working volume. The current in a gradient coil is typically switched many hundreds of times per second.

Switching of the gradient coil and the associated magnetic field change induce electric currents in nearby electrically conducting, in particular, metallic bodies. When these bodies are simultaneously exposed to a strong magnetic field, which prevails radially inside the magnet winding of the magnet coil, these electric currents produce Lorentz forces which elastically deform the bodies. Due to repeated switching of the gradient coil, the electrically conducting bodies are caused to oscillate.

The oscillating motion of an electrically conducting body in a strong magnetic field, in turn, produces eddy currents in this body. These eddy currents produce heat due to the ohmic resistance in the body and also cause a magnetic field change in the surroundings which may, in turn, produce differing induced currents in neighboring electrically conducting bodies etc. In consequence thereof, all electrically conducting bodies within the magnet winding substantially oscillate with electromagnetic coupling and are heated.

A coil carrier of the magnet coil or an inner wall of a helium tank which contains the magnet coil are e.g. oscillating bodies in a superconducting magnet coil system, in which eddy currents can produce heat. For magnet coils which are in contact with liquid helium, this results in undesired evaporation of large amounts of expensive liquid helium. Moreover, the heat may be transferred to the superconducting wire of the magnet coil, and the superconducting wire could be heated beyond the transition temperature thereby bringing the magnet coil into the undesired, normally conducting state with associated complete decay of the magnetic field as well as strong heating. The magnet coil would then have to be recooled with liquid helium, which is expensive, and the magnetic resonance apparatus would be inoperative for several days.

Conventional gradient coils are actively shielded to reduce the eddy current effects and resulting heating of the magnet coil.

DE 101 27 822 A1 proposes providing a magnet system with an inner, a central, and an outer unit, wherein the units are nested within each other. The mechanical properties of the units are thereby matched, such that the central unit damps transfer of oscillations due to magnetic coupling from the outer to the inner unit. This also reduces heating of the magnet coil.

In a magnetic resonance apparatus comprising a magnet configuration with room temperature bores having large diameters of 40 cm and more, the heat input into the magnet coil is excessively large for permanent operation despite the conventional measures. For cooling the magnet coil with liquid helium, the overall typical supply of liquid helium would e.g. evaporate within a few hours.

In contrast thereto, it is the underlying purpose of the invention to provide a superconducting magnet configuration which further reduces the heat input into the magnet coil.

SUMMARY OF THE INVENTION

This object is achieved by a superconducting magnet configuration of the above-mentioned type which is characterized in that all low temperature oscillation systems (R1) have electrical conductivity values $\rho1=\sigma1*d1$, with $\rho1>1*10^6$/ohm at the respective temperature T1 at least one warm oscillation system (R2, R2') has an electrical conductivity value $\rho2=\sigma2*d2$ with $1*10^2$/ohm$<\rho2<1*10^6$/ohm at the associated temperature T2, and that the characteristic mechanical value q2 of this at least one warm oscillation system (R2, R2') differs from the characteristic mechanical value q1 of at least one low temperature oscillation system (R1) by at least a factor of 1.5.

In accordance with the inventive superconducting magnet configuration, heating due to eddy currents based on ohmic resistance takes place largely in the at least one warm oscillation system with the stated values for electrical conductivity value and characteristic mechanical value, whereas there is at most only little heating in all low temperature oscillation systems.

The surprising findings of the invention consist in that despite the considerably smaller electrical conductivity value p2 of the at least one warm oscillation system compared to the low temperature oscillation systems, the strength of the eddy currents in all oscillation systems within the magnet winding of the magnet coil have the same magnitude and low strength with the inventive setting of the characteristic mechanical values q1, q2. The oscillation amplitudes in all oscillating systems therefore have the same magnitude and are very small. This is apparently due to the fact that the mechanical oscillation of the at least one warm oscillation system produces a considerable heating power inversely proportional to its electrical conductivity value p2. This apparently damps the oscillation amplitudes and also the amplitudes of the eddy currents of all other oscillation systems due to inductive couplings among all oscillation systems when the characteristic mechanical values are set in accordance with the invention. Due to the high electrical conductivity values p1 of all low temperature oscillation systems, the latter generate only a highly reduced and substantially insignificant heating power. The inventive setting of the characteristic mechanical values apparently causes the mechanical oscillations in the low temperature and warm oscillation systems to be largely opposite in phase over wide frequency ranges. These oppositely phased oscillations cause very large electric heating power in the at least one warm oscillation system which are highly damped in all warm and low temperature oscillation systems. When exactly one low temperature and exactly one warm oscillation system are provided, eddy currents are produced in these two oscillation systems, which are approximately identical but opposite in direction.

The low temperature oscillation systems are in close thermal contact with the superconducting wire of the magnet coil (e.g. via liquid helium) whereas all warm oscillation systems are thermally decoupled from the magnet coil (e.g. through vacuum barriers and radiation shields). The heating power of the eddy currents is proportional to the ohmic resistance passed by the eddy currents.

In accordance with the invention, all low temperature oscillation systems have a considerably higher electrical conductivity value than the at least one warm oscillation system, and therefore the major part of the electric heating power is produced in the at least one warm oscillation system, at which location, the emitted heat neither endangers the superconducting wire nor burdens an associated helium-based cooling system. Cooling is also considerably facilitated and less expensive compared to the low temperature oscillation systems. The following preferably applies for the at least one warm oscillation system (R2, R2'):

$1*10^2/\text{ohm} < p2 < 1*10^5/\text{ohm}$ at a temperature T2. Moreover, the following preferably also applies for the at least one warm oscillation system (R2, R2'): $1*10^2/\text{ohm} < p2 < 0.2*p1$ compared to all low temperature oscillation systems (r1), wherein p2 is determined for T2 and p1 for T1.

The thermal energy which is generated by the ohmic heating power of the eddy currents in the at least one warm oscillation system is withdrawn from all oscillation systems of the magnet configuration and, in particular, is no longer available as kinetic energy in the mechanical oscillations of the oscillation systems. In other words, the amplitude of the forced oscillation of the oscillation systems is reduced, i.e. the forced oscillation is damped. This reduced oscillation amplitude reduces magnetic field fluctuations which, in turn, reduce induced electric currents (in particular in low temperature oscillation systems which are further outside).

In one preferred embodiment of the inventive superconducting magnet configuration, the characteristic mechanical value q2 of the at least one warm oscillation system (R2, R2') differs from the characteristic mechanical values q1 of all low temperature oscillation systems (R1) by at least a factor 1.5. This ensures that the warm oscillation system oscillates with respect to all low temperature oscillation systems which reduces the eddy current effects.

In one preferred embodiment of the inventive superconducting magnet configuration, all warm oscillation systems (R2, R2') have an electrical conductivity value $p2=\sigma2*d2$, with $1*10^2/\text{ohm} < p2 < 1*10^5/\text{ohm}$ at the respective temperature T2. This results in good heating power of all warm oscillation systems and corresponding strong damping of the mechanical oscillations and eddy currents in all low temperature oscillation systems, and therefore in a particularly low electric heating power.

In another preferred embodiment, several low temperature oscillation systems are provided whose characteristic mechanical values q1 differ by at least a factor of 1.5, in particular, wherein low temperature oscillation systems with higher characteristic mechanical values q1 are disposed radially further inward. This also results in decoupling within the low temperature area, which further reduces the eddy current effects.

In one particularly preferred embodiment, exactly one low temperature oscillation system (R1) is provided. This improves the distribution of the eddy currents among the oscillation systems and reduces the heat input into the magnet coil to prevent, in particular, several low temperature oscillation systems from oscillating with respect to each other.

In one particularly preferred embodiment, exactly one warm oscillation system (R2) is provided which also improves the distribution of the eddy currents among the oscillation systems and reduces the heat input into the magnet coil. By using exactly one low temperature and exactly one warm oscillation system one obtains, in particular, a particularly favorable eddy current distribution inside the magnet winding.

In one further preferred embodiment, all low temperature oscillation systems (R1) are produced from copper or a copper alloy, in particular, wherein $\sigma1 > 6*10^8/(\text{ohm m})$, preferably $\sigma1 > 3*10^9/(\text{ohm m})$ at a temperature Ti. Copper and copper alloys are metals having particularly small characteristic mechanical values q1 of approximately $2.6\times10^7$ Nm/kg which meet particularly well the inventive material requirements (in particular in combination with non-magnetic stainless steel) and are a preferred material for the low temperature oscillation system. Copper also realizes particularly large electric conductivities $\sigma1$ and particularly large electrical conductivity values p1 at temperatures T1<5K.

In one preferred superconducting magnet configuration in accordance with the invention, at least one warm oscillation system (R2, R2') is produced from nonmagnetic stainless steel. Nonmagnetic stainless steel is an alloy with a particularly small electric conductivity $\sigma2$ and is therefore particularly suited to realize the inventive electrical conductivity values. Values of $\sigma2=1.4\times10^6/\Omega/\text{m}$ and wall thicknesses d2 of between 1 mm and 10 mm produce electrical conductivity values of $1.4\times10^3/\Omega$ and $1.4\times10^4/\Omega$ which are within the inventive range. Nonmagnetic stainless steel is moreover a metal with a relatively high characteristic mechanical value $q2=2.6\times10^7$ Nm/kg and therefore provides certain flexibility in view of the material of a low temperature oscillation system.

In one advantageous embodiment, a low temperature oscillation system (R1) is formed by a carrier tube of the magnet coil, which renders the carrier tube multi-functional.

In a preferred embodiment, a helium tank is provided for liquid helium and the magnet coil is disposed in the helium tank. Liquid helium permits effective cooling of the magnet coil, in particular, to a temperature of 4.2 K and below. This has proven to be advantageous, in particular, for magnetic resonance apparatus.

In a preferred further development of this embodiment, the radially inner wall of the helium tank is produced from copper or a copper alloy. The radially inner wall of the helium tank forms a low temperature oscillation system (or part thereof) and has the inventive electrical conductivity value and characteristic mechanical value.

In a further preferred development of the above-mentioned embodiment, a radially inner wall of the helium tank and a carrier tube of the magnet coil are non-positively connected to each other, and the radially inner wall of the helium tank and the carrier tube form together a low temperature oscillation system (R1). Alternatively, a radially inner wall of the helium tank may be designed as a carrier tube of the magnet coil, and the radially inner wall of the helium tank may form a low temperature oscillation system (R1). In either case, one single low temperature oscillation system is sufficient. An inner tube of the helium tank, which is e.g. separated from the carrier tube and also has a very large electrical conductivity value, and the carrier tube are prevented from vibrating relative to each other in a practically undamped fashion due to their large conductivity values, which would result in eddy currents with large amplitudes in both tubes of a magnitude producing higher electric heating power in both tubes despite the high conductivity values, which would both increase the helium consumption.

In one further preferred embodiment, the superconducting magnet configuration has a cryostat, wherein the inner tube of the outer container of the cryostat forms a warm oscillation system (R2). This is advantageous in that the important function of oscillation damping can be met by one single component with the generally required function of sealing the outer container, which at the same time represents a vacuum container. However, the oscillation damping function, which is always effected in accordance with an electromechanical principle, requires the inner tube of the outer container to freely oscillate without being impaired by a gradient coil mounted directly therein. Alternatively, a warm oscillation system may be disposed in the outer container of the cryostat to prevent noise from being generated by oscillations of the warm oscillation system.

In an advantageous embodiment, a warm oscillation system (R2) is disposed within the room temperature bore, in particular, between a gradient coil and the room temperature bore. The two functions of oscillation damping and sealing can then be separated. The inner tube of the outer container or cryostat is then e.g. of electrically nonconducting material, e.g. glass fiber-reinforced plastic material. It is then possible to optimize the wall thickness d2 of the warm oscillation system exclusively in view of oscillation damping. d2 may thereby be 1-2 mm, i.e. smaller than usually admissible for an inner tube of a vacuum container.

In one particularly preferred embodiment of the inventive superconducting magnet configuration, at least one radiation shield is disposed between a low temperature oscillation system (R1) and a warm oscillation system (R2, R2'), in particular, wherein the radiation shield can be cooled with liquid nitrogen or a refrigerator. The radiation shield protects the low temperature areas of the magnet configuration from thermal radiation.

In a particularly preferred further development of this embodiment, the radiation shield is substantially tubular and subdivided several times in the peripheral direction. The radiation shield is preferably subdivided or slotted more than 100 times. The function of a radiation shield (or its inner tube) consists in transporting heat in its longitudinal direction. For this reason, metals are used which have a relatively large thermal conductivity. The thermal conductivity of a metal is proportional to its electric conductivity in accordance with the Wiedemann-Frantz Law. For this reason, tubes of aluminium or an aluminium alloy or in accordance with U.S. Pat. No. 6,707,302 B2, of copper or brass are usually used. When the metallic tubes are not subdivided in the peripheral direction, eddy currents are formed therein which are changed or increased through vibrations and influence, usually increase, the eddy currents in all other tubes. The eddy currents in the radiation shields can be almost completely suppressed by the subdivision. Towards this end, the number of subdivisions must be sufficiently large so that the width of the remaining metal bars is sufficiently small to largely prevent eddy currents and associated vibrations. It is thereby possible to realize an arrangement, wherein exclusively one low temperature and one warm oscillation system carry substantial eddy currents and therefore determine the function of the configuration. It is thereby possible to realize particularly small values of the transfer functions $V_{01}$ (see below) and correspondingly small heating powers. One possibility of realization is e.g. a tissue of metallic veins which extend in a longitudinal direction, and strips of nonconducting material which extend in the peripheral direction, e.g. plastic material reinforced by glass fibers. The subdivision in the peripheral direction can also be realized with strands of wire with mutually insulated veins, wherein the strands may e.g. be mounted to a carrier tube of electrically nonconducting material. A slotted radiation shield is not an oscillation system in accordance with the present invention, since it does not have the required electrical conductivity value in the peripheral direction.

In a preferred further development of this embodiment, the radiation shield is produced from aluminium or an aluminium alloy. The low temperature oscillation system is then typically produced from copper and the warm oscillation system from steel. The values of a transfer function $V_{01}$ (see below) are thereby fundamentally larger than in radiation shields which are subdivided several times in the peripheral direction. However, a closed tube of aluminium or an aluminium alloy is also suited and less expensive than a tube which is subdivided several times in the peripheral direction. A radiation shield of copper or a copper alloy is not suitable.

In one preferred embodiment, a gradient coil is disposed within the room temperature bore, in particular, an actively shielded gradient coil. The gradient coil encodes the measuring signal. Active shielding reduces the eddy current effects by switching of the gradient coil.

In one particularly preferred further development of this embodiment, the gradient coil has a mounting which is independent of a warm oscillation system (R2) disposed next to it in a radially outer direction. In other words, the gradient coil is not directly mounted to the warm oscillation system or tube R2. In this fashion, the tube R2 can largely freely oscillate in different modes. Its oscillation in the background field B and the eddy currents induced thereby and the inductive coupling with the warm oscillation system or tube 1 damp the amplitudes of the eddy currents and also the amplitudes of the oscillations themselves, in both tubes. In this fashion, the heating power generated in R1 is very small. If the gradient coil should nevertheless be directly mounted in the inner tube of the outer container, the tube R2 is preferably disposed radially outside of the inner tube of the outer container, if possible at an operating temperature T2 which is approximately equal to the room temperature.

In one advantageous embodiment, the at least one warm oscillation system (R2, R2') is self-supporting in the axial direction over a length which corresponds to at least 80% of the length of the magnet coil. The warm oscillation system is not supported in a radial inward or outward direction along this length. The warm oscillation system or tube R2 is advantageously not supported relative to other bodies in an inward or outward direction in its central axial area over at least 80% of its length. In this fashion, the tube R2 can largely freely oscillate in different modes. Its oscillation in the background field B, the eddy currents induced thereby and the inductive coupling to the low temperature oscillation system R1 damp the amplitudes of the eddy currents and also the amplitudes of the oscillations themselves, in both tubes. The heating power produced in the low temperature oscillation system R1 is thereby particularly low.

In one preferred embodiment, the magnet coil comprises a main field section which is surrounded by a tube (R3), wherein the tube (R3) has an electrical conductivity value $p3>1*10^6$/ohm at a temperature $T1<10K$, in particular, wherein a shielding section of the magnet coil is disposed radially outside of the tube (R3). In the area closely outside of the main field section, the magnetic field is substantially smaller than in the working volume of the magnet configuration and in the area of the oscillation systems or tubes R1 and R2. The eddy currents induced in the tube R3 produce only little mechanical oscillations due to the sufficiently small Lorentz forces. In this fashion, the tube R3 shields the disturbing fields associated with the eddy currents in R1 and R2 already at smaller frequencies of a few Hz to the outside due to its large electrical conductivity value p3, thereby preventing eddy currents in metallic bodies disposed further outside, in particular, coil bodies of shielding sections of the magnet coil or in the outer tube of a helium container. The large electrical conductivity value p3 also prevents generation of a larger electric heating power in the tube R3. The shielding section is disposed outside of the tube R3, and therefore no eddy currents form in the metallic carrier tubes of the shielding section, that would produce additional heating.

In another preferred embodiment, $1.5*q1<q2$ and preferably $2*q1<q2$. The characteristic mechanical value of the at least one low temperature oscillation system can be easily adjusted through suitable material selection, e.g. copper. The resonance frequencies of the low temperature and warm oscillation sections differ greatly and the oscillation coupling is reduced.

In one particularly preferred embodiment, at least one low temperature oscillation system (R1) has a mechanical resonance frequency of 1.5 kHz or less, and at least one warm oscillation system (R2, R2') has a mechanical resonance frequency of 2.5 kHz or more. At a gradient system operating frequency of approximately 1.5 kHz to 2.5 kHz, the mechanical oscillations of the low temperature and warm oscillation systems are opposite in phase to damp oscillation coupling.

In one preferred embodiment, the diameter D of the room temperature bore is D>0.4 m and preferably D>0.6 m. For larger magnet bore diameters, the resonance frequencies of metallic tubes are in a gradient coil current operation range of approximately 0.5 kHz to approximately 2.5 kHz in accordance with equation (1) (see below), wherein the amplitude ratios A1/A0 and thereby the electric heating power P1 are particularly large in conventional configurations. The advantages of the invention can therefore be particularly utilized.

In another preferred embodiment, T2>20K and preferably T2>40K, and preferentially T2=approximately room temperature. When T2 is e.g. approximately 20K to 40K, the heating power produced during oscillation damping in the warm oscillation system or tube R2 is not discharged into the helium tank, but can be discharged e.g. through cooling with the cold head of a refrigerator. When T2 is the room temperature (approximately 20° C.), the heating power due to oscillation damping only slightly heats the warm oscillation system or tube R2 even at a magnitude of more than 10 W, and can optionally be discharged through water or air-cooling.

In a further advantageous embodiment, the strength of the magnetic field in the working volume is at least 3 Tesla, and preferably at least 5 Tesla. The amount of liquid helium (for helium cooling) that evaporates in magnet configurations with large magnetic field strength is particularly large and the features of the present invention can be utilized with particular advantage.

Finally, in another preferred embodiment, each oscillation system (R1, R2, R2') is designed as a tube. In this case, the oscillation systems can assume further required functions e.g. of a coil body, an inner tube of a helium container, or an outer container.

Further advantages of the invention can be extracted from the description and the drawing. The features mentioned above and below may be used in accordance with the invention either individually or collectively in arbitrary combination. The embodiments shown and described are not to be understood as an exhaustive enumeration but have exemplary character for describing the invention.

The invention is schematically shown in the drawing and explained in more detail with reference to embodiments.

BRIEF DESCRIPTION OF THE DRAWING

FIG. 6a shows a plot of the heating power in the inner cryostat wall and in the inner tube of the helium container of FIG. 1, FIG. 6b shows a plot of the heating power in the inner tube of the helium container of FIG. 1;

FIG. 7 shows a plot of the heating power in the inner tube of the helium container of FIG. 2;

FIG. 8 shows a plot of the heating power in the inner tube of the helium container of FIG. 3;

Figure 1:
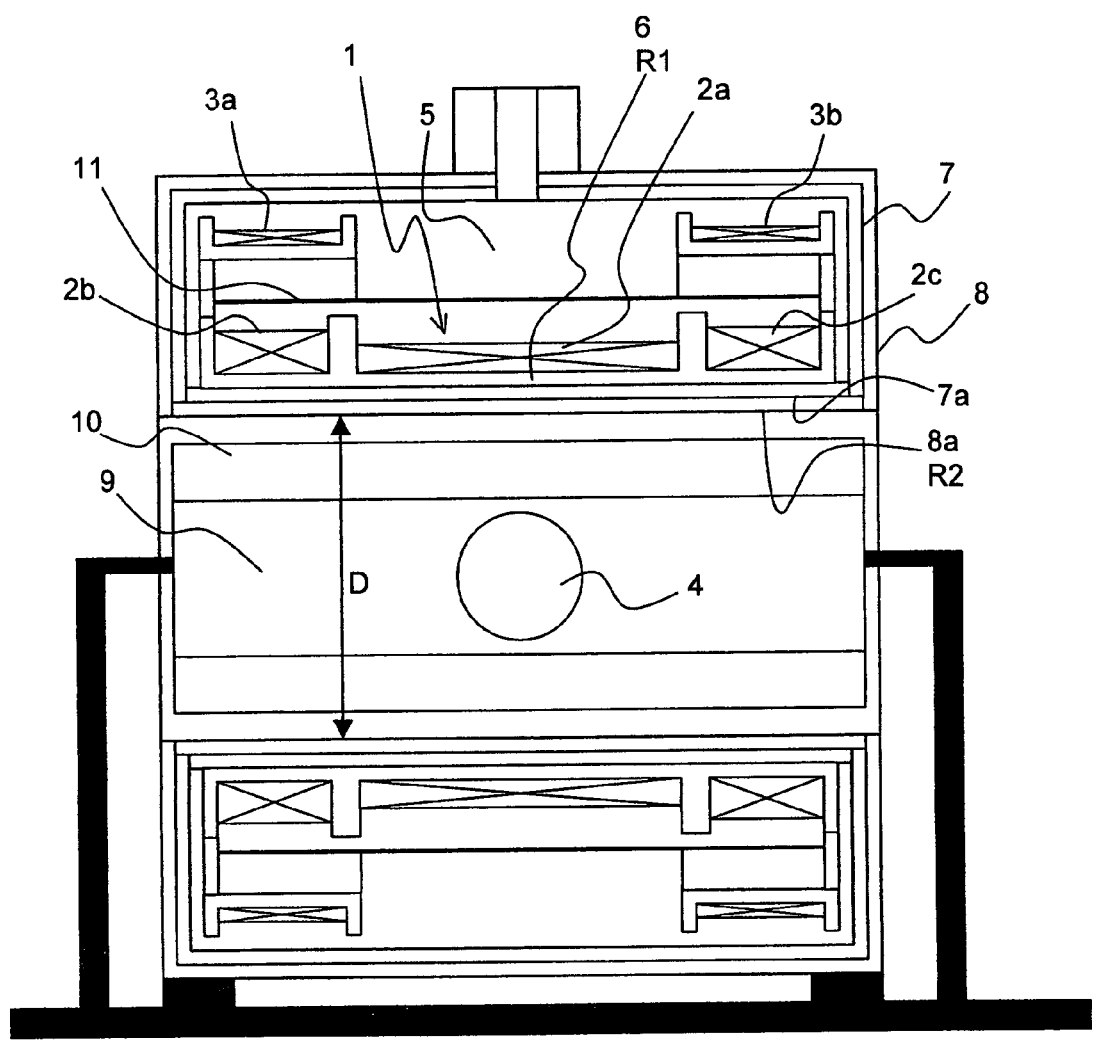
FIG. 1 shows an inventive superconducting magnet configuration with exactly one low temperature oscillation system which is formed by the inner tube of the helium tank, exactly one warm oscillation system which is formed by the inner cryostat wall, and with one slotted radiation shield.

DESCRIPTION OF THE PREFERRED
EMBODIMENT

The invention concerns the improvement of a superconducting magnet configuration of a magnetic resonance apparatus.

Superconducting magnet configurations which can be improved by the present invention are disclosed e.g. in DE 10127822 A1 and U.S. Pat. No. 6,707,302 B2.

The magnet configuration comprises a magnet winding of superconducting wire which is disposed about a radially inner carrier tube R1. The carrier tube and the magnet winding form the superconducting magnet coil, optionally together with magnet windings of superconducting wire which are disposed radially further outside and e.g. reduce the stray magnetic field in the surroundings of the magnet configuration. Materials for the carrier tubes R1 are generally aluminium alloys or nonmagnetic stainless steel. The magnet coil is at an operating temperature of less than 10 K so that the superconducting wire is in a superconducting state. The magnet coil is located in a cryostat in order to provide this operating temperature. The cryostat has further concentric metallic tubes radially inside of the carrier tube R1, which are either parts of radiation shields or parts of containers. The magnet coil is usually located in a helium tank of nonmagnetic stainless steel, whose inner tube represents such a metallic further tube. Radiation shields are at operating temperatures between 15 K and 100 K and usually consist of aluminium. The inner tubes of the radiation shields, which also represent further metallic tubes, are disposed radially inside the carrier tube R1. A cryostat basically has an outer container which surrounds the helium tank and all radiation shields. The cryostat is at room temperature and constitutes a vacuum container. The latter prevents thermal conduction between the outer container and the magnet coil or the helium tank through gas. The function of the radiation shields is to further reduce heat input to the magnet coil or the helium tank through thermal radiation. The outer container has an inner tube which also represents the room temperature bore of the cryostat. It may consist of metal, in general like the entire outer container of nonmagnetic stainless steel, and thereby represent a further metallic tube within the carrier tube R1.

The magnet coil generates a static magnetic field, which is suited for magnetic resonance measurements, in a working volume in the area of its center. Typical magnetic field strengths are between 0.5 T and 20 T.

In magnetic resonance apparatus, a tubular gradient system is generally located in the room temperature bore of the cryostat, which comprises three gradient coils which superpose three switchable additional fields on the magnetic field generated by the magnet coil in the working volume. In accordance with prior art, the three gradient coils are actively shielded to minimize the magnetic stray field generated by them radially outside of the gradient system. There are conventional configurations, with which the gradient system is directly mounted in the room temperature bore of the cryostat. In other configurations, the gradient system is mounted to the side plates of the outer container or on the floor outside of the cryostat. The inside of the tubular gradient system surrounds the working volume and forms the access to the object under investigation.

There are conventional configurations, with which the inner tube of the outer container is not electrically conducting but consists e.g. of plastic material reinforced by glass fibers.

There are also conventional configurations, with which the carrier tube R1 of nonmagnetic stainless steel of the magnet coil also represents the inner tube of the helium tank.

There are also conventional configurations, with which no helium container is provided, rather the magnet coil is connected to the cold finger of a cold head of a refrigerator in a thermally conducting fashion.

In any event, a substantial function of the cryostat is to provide optimum thermal insulation between the magnet coil or helium tank and the outer container. For magnet systems with a helium tank, the consumption of liquid helium thereby remains low. There are also conventional configurations with a helium tank and active cooling by a refrigerator, whereby no liquid helium is consumed at all. In conventional magnet configurations, the thermal power supplied to the helium tank or the magnet coil through thermal conduction or thermal radiation is less than approximately 0.5 W.

As addressed in U.S. Pat. No. 6,707,302 B2, eddy currents are induced, in particular, in magnet configurations with relatively large room temperature bores of between 0.5 m and 1 m and large magnetic field strengths of more than 3 T during switching of currents in the gradient coils due to stray fields of the gradient coils in the metallic tubes of the cryostat and carrier tube R1. These are associated with Lorentz forces due to the static background field B generated by the magnet coil in the area of these tubes, and produce mechanical oscillations of these tubes due to the final modulus of elasticity E, thereby, in turn, modifying the strength of the eddy currents. Eddy currents of considerable strength may also be produced in the inner tube of the helium tank or in the carrier tube R1, in particular, during operation of the gradient coils with alternating currents at frequencies in the range of the mechanical resonance frequencies of the tubes. In this fashion it is possible to generate electrical heating powers of more than 10 W or even more than 100 W in these tubes, in consequence of which the magnet configuration becomes practically useless due to excessive evaporation of liquid helium or heating of the magnet coil.

DE 3900725 C2 or U.S. Pat. No. 6,501,275 B2 of the Assignee describe e.g. configurations which utilize the shielding effect of electrically conducting tubes, which surround non-shielded or insufficiently shielded gradient systems, in the space surrounding these tubes. This shielding effect of conducting tubes in the high-frequency range of more than approximately 1 to 100 Hz is largely lost in higher static background fields B at values of already more than approximately 1 T, and, instead of shielding, can actually cause an increase in eddy currents induced in these tubes mainly through mechanical vibrations in the mechanical or higher resonance frequency range of these and further electrically conducting tubes disposed further outside. This effect is generally increased with even stronger background fields B in the range of 7 T.

As mentioned in U.S. Pat. No. 6,707,302 B2, the mechanical resonance frequency $f0$ of a tube for radial oscillation modes is $$f0 = 1/(2\pi r)(E/\rho)^{1/2}$$

E: modulus of elasticity $\rho$: density r: radius

The wall thickness does not decrease since e.g. with increasing wall thickness d, the spring constant and also the mass increase equally and the resonance frequency therefore remains unchanged.

In magnet configurations in accordance with previous prior art (see U.S. Pat. No. 6,707,302 B2), the materials of the inner tube of the outer container and the helium tank (both of nonmagnetic stainless steel), and the radiation shields (aluminium) have approximately equal characteristic mechanical values q=E/ρ and thereby approximately the same resonance frequencies. The amplitude of the eddy currents in the inner tube of the helium tank and subsequently the heating power transformed in the helium tank are therefore particularly large.

In accordance with U.S. Pat. No. 6,707,302 B2, the amplitudes of the eddy currents in the inner tube of the helium tank are considerably decreased by an "intermediate unit", e.g. preferably a radiation shield, disposed between the inner tube of the helium tank and the inner tube of the outer jacket and made from a material having a characteristic mechanical value q which greatly differs from the characteristic mechanical value of the inner tube of the helium tank and of the outer jacket, and which is preferably made from copper or a copper alloy. The characteristic mechanical value q of copper and the copper alloys is only approximately half that of aluminium or nonmagnetic stainless steel. In this fashion, the electric heating power is considerably reduced through vibration-reinforced eddy currents in the inner tube of the helium tank.

The general findings of U.S. Pat. No. 6,707,302 B2, that different characteristic mechanical values of the different inner tubes of a cryostat play an important role, is confirmed by analysis. This is an important, but not a sufficient finding for planning magnet configurations with small heating power in the region of the magnet coil. The fundamental importance assigned to the material and characteristic mechanical value of the "intermediate unit", i.e. a radiation shield, in U.S. Pat. No. 6,707,302 B2, was not confirmed in the intensive analyses. In particular, U.S. Pat. No. 6,707,302 B2 does not take into consideration the influence of the carrier tube of the magnet coils (R1), which is also disposed in the helium tank.

One particular object of the present invention is to considerably reduce the electric heating power supplied to the magnet coil or the helium tank through vibration-reinforced eddy currents compared to the configurations proposed in U.S. Pat. No. 6,707,302 B2, i.e. by factors >10, preferably >100.

This object is achieved by the configuration of claim 1 in a surprisingly simple but effective fashion.

Decisive thereby is the finding that two oscillation systems, i.e. coaxial tubes R1 and R2 are present which have different characteristic mechanical values q and therefore different mechanical resonance frequencies, and also greatly differing electrical conductivity values ρ=σd, σ: average electric conductivity at the operating temperature; d: wall thickness of the tube.

Due to the different mechanical resonance frequencies, these tubes oscillate in opposing cycles. Due to the small electrical conductivity value of one of the two tubes, this oscillation is damped due to generation of heat in the tube with the smaller electrical conductivity value. It is interesting that the strengths of the eddy currents in both tubes, associated with this oscillation, have the same magnitude and are largely opposite, while the mechanical oscillation amplitude in the tube with the smaller electrical conductivity value is considerably larger than of the tube with the large electrical conductivity value, i.e. approximately proportional to the inverse ratio of the two conductivity values. The mechanical oscillation is thus mainly damped in the tube with the smaller electrical conductivity value and its energy is converted into heat.

On the basis of these new findings, the invention proceeds as follows: The tube R1 with the large electrical conductivity value is used to meet a suitable structural function, e.g. that of a carrier tube of the magnet coil or of an inner tube of the helium tank at the extremely low operating temperature (e.g. T1) of the superconducting magnet coil, and the tube R2 with the small electrical conductivity value for the mentioned function of oscillation damping or also for a further structural function such as that of the inner tube of the outer jacket of the magnet configuration. At an increased temperature T2 of this further tube R2, the heating power generated in this tube through oscillation damping is less disadvantageous or can be completely neglected.

It is also decisive that in the low temperature range, in particular, within the magnet coil and at the operating temperature of the magnet coil, no further oscillation system or tube with small electrical conductivity value is present, in which oscillation energy connected with large electric heating performance is damped.

This implies an entirely unconventional method for a magnet configuration in a helium tank, i.e. the inner tube of the helium tank can no longer consist of nonmagnetic stainless steel with a wall thickness of some mm, which is usually always the case, since its electrical conductivity value p would be too small for the present invention. Materials which are better suited are copper with a high electrical conductivity value or also electrically nonconducting materials such as fiber-reinforced plastic materials. In embodiments with a warm oscillation system or tube R2 of nonmagnetic stainless steel, the inner tube of the helium tank is also inappropriate due to its identical characteristic mechanical value.

The configuration described in the embodiment of U.S. Pat. No. 6,707,302 B2 comprises an inner tube of the helium tank and also a carrier tube of stainless steel at an operating temperature of typically 4.2 K, which can cause considerable evaporation rates of liquid helium. The example of U.S. Pat. No. 6,707,302 B2 shows the strong bias among experts, who are familiar with the problems discussed herein, that an inner tube of a helium tank must be made from nonmagnetic stainless steel.

DE 3900725 C2 does not recognize or describe vibration-induced eddy currents under the influence of a background field B and the importance of mechanical properties and characteristic values and their interaction with the electrical conductivity values.

In inventive configurations, which are analog to other metallic tubes, the heating power P1 generated in the low temperature oscillation system or tube R1 is:

$$P1 = A1^2 V_{01}^2 g r1 (\pi f \mu_0/\sigma 1)^{-1/2}, \text{ for } \delta < d1 \quad (2)$$

and $$P1 = A1^2 V_{01}^2 g (r1/\rho 1) \text{ for } \delta > d1 \quad (3)$$

A0: non compensated ampere winding number of the gradient coil;

A1: ampere winding number of the eddy currents induced in tube R1;

$V_{01}$=A1/A0: frequency-dependent transfer function;

g: factor which depends on the geometry of the configuration and the oscillation type, r: radius of the tube R1;

$\delta = (\pi f \mu_0 \sigma 1)^{-1/2}$: skin depth;

f: frequency;

μ₀: induction constant

Clearly, in accordance with equations (2) and (3), no heating power P1 is produced when the gradient coil is perfectly actively shielded and the non-compensated ampere winding number A0 therefore vanishes. This is generally not the case in practice due to mechanical tolerances during production of the actively shielded gradient coil and the skin effect in the electric conductors of the gradient coil.

Both U.S. Pat. No. 6,707,302 B2 and the present invention minimize the transfer function $V_{01}=A1/A0$ but in completely different ways, although similar in terms of magnitude. This is decisively advantageous for the present invention, since the heating power according to (2) and (3) decreases with increasing electric conductivity σ1. Equation (2) applies in the frequency range which is relevant for the object to be solved, of 0.5 to 2.5 kHz, which also contains the switching frequencies of the currents in the gradient coils of magnetic resonance apparatus, and the required large electrical conductivity value p1. P1 is obviously inversely proportional to the square root of the electric conductivity σ1 with otherwise identical ratios. Since, in conventional configurations, e.g. in accordance with U.S. Pat. No. 6,707,302 B2, the inner tube of a helium tank is made from nonmagnetic stainless steel having an electric conductivity of $1.4 \times 10^6/\Omega/m$, and, in the present invention, from copper with an electric conductivity of $6 \times 10^9/\Omega/m$, one obtains a heating power P1, which is smaller by a factor of approximately 65, and a correspondingly reduced liquid helium consumption.

An "oscillation system" in accordance with the invention is a body or composite body which, as a whole, is subjected to uniform oscillations, wherein different oscillation systems must be able to oscillate relative to each other.

A tube is e.g. a simple oscillation system. Two tubes which are disposed coaxially to each other and are rigidly connected to each other only at the ends, may oscillate relative to each other and therefore represent different oscillation systems. In contrast thereto, two coaxial tubes which are non-positively connected to each other via their entire mutually facing cylinder jacket surfaces only represent one oscillating system, since they cannot oscillate relative to each other. They oscillate in a uniform fashion with respect to amplitude and phase.

The oscillation of an oscillation system must be excitable via electromagnetic coupling. This is defined by the minimum value of the electrical conductivity value of the oscillation system in the peripheral direction. Non-conductive tubes are therefore not oscillation systems in accordance with the invention. However, a non-conductive tube can be coated with or otherwise be rigidly connected to a material having excellent conducting properties (composite tube) to obtain an overall electrical conductivity value in accordance with the invention.

A tube which is interrupted (slotted) along its periphery has an electrical conductivity value of zero in the peripheral direction and therefore does not represent an inventive oscillation system.

FIG. 1 shows a schematic cross-section of an inventive superconducting magnet configuration. A substantially circular cylindrical jacket-shaped magnet coil 1 comprises a main field section with a central section 2a and axially outer sections 2b, 2c, and a shielding section disposed radially further outside and comprising sections 3a, 3b. A copper tube 11 extends between the main field section 2a-2c and the shielding section 3a-3b. The magnet coil 1 generates a homogeneous magnetic field B in a working volume 4. The cylinder axis of the magnet coil 1 extends horizontally through the center of the working volume 4 in the representation of FIG. 1. The magnetic field B extends parallel to the cylinder axis (z direction) and has a strength of 7 Tesla in the working volume 4.

Figure 5:
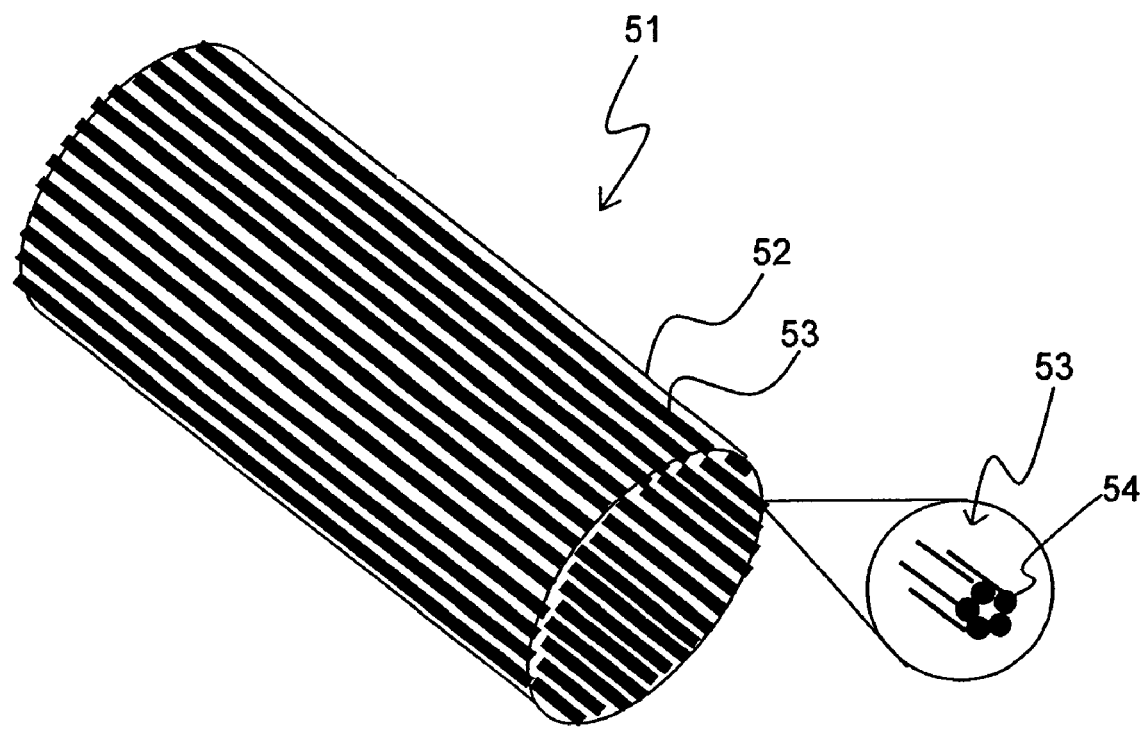
FIG. 5 shows a slotted radiation shield for use with the invention.

The magnet coil 1 is housed in a helium tank 5, which is at least partially filled with liquid helium of a temperature of 4.2 K. A carrier tube of the magnet coil 1 simultaneously forms the radially inner wall 6 of the helium tank 5. A radiation shield 7 is disposed around the helium tank 5. A section 7a of the radiation shield 7, which is disposed within the magnet coil 1, is slotted several times in the peripheral direction, i.e. it consists of a plurality of electric conductors which extend parallel in an axial direction and are insulated from each other (FIG. 5). The radiation shield 7 is cooled with a refrigerator (not shown). The helium tank 5 and the radiation shield 7 are disposed inside of an evacuated cryostat 8. The radially inner wall 8a of the cryostat 8 delimits an axial room temperature bore 9 of a diameter D. A gradient coil 10 (or a gradient coil system) is disposed in the room temperature bore 9, and can generate additional magnetic gradient fields in the working volume 4. The working volume 4 is inside the gradient coil 10.

The inventive magnet configuration comprises exactly two oscillation systems in accordance with the invention, radially inside of the main field section: the radially inner wall 6 of the helium tank 5 as the low temperature oscillation system R1 (at the temperature of liquid helium at approximately 4.2 K), and the radially inner wall 8a of the cryostat 8 (the inner tube of the outer jacket) at room temperature as the warm oscillation system R2.

The gradient coil 10 is not an oscillation system in accordance with the invention, since it represents the excitation means. Nor is the radially inner section 7a of the radiation shield 7 an inventive oscillation system, since the section 7a is slotted in the peripheral direction and is therefore not electrically conducting in the peripheral direction. Moreover, the tube 11 is also not an inventive oscillation system, since it is outside of the main field section and parts thereof 2a, 2b, 2c.

The warm oscillation system R2, i.e. the cryostat inner wall 8a, consists of a tube of nonmagnetic stainless steel of a wall thickness of 4 mm in the radial direction, with a radius of 0.47 m. The electrical conductivity value is $\rho2=5.7 \times 10^3/ohm$. The characteristic mechanical value is $q2=2.6 \times 10^7 Nm/kg$. The inner slotted section 7a of the radiation shield 7 has a radius of 0.485 m, a thickness of 4 mm, and an electrical conductivity value $\rho=0$. The low temperature oscillation system R1, i.e. the inner tube 6 of the helium tank 5 has an inner radius of 0.5 m, an outer radius of 0.51 m, a thickness of 10 mm, and consists of copper. The conductivity value $\rho1$ is $2.9 \times 10^7/ohm$. The characteristic mechanical value is $q1=1.35 \times 10^7$ Nm/kg and thus smaller than q2 by a factor of 1.93. The main section of the magnet coil 1 is wound with a superconducting wire of 80% copper and 20% Niobium Titanium, with an inner diameter of 0.51 m and an outer diameter of 0.6 m, and with $\rho=0$. The tube 11 is made from copper.

Figure 2:
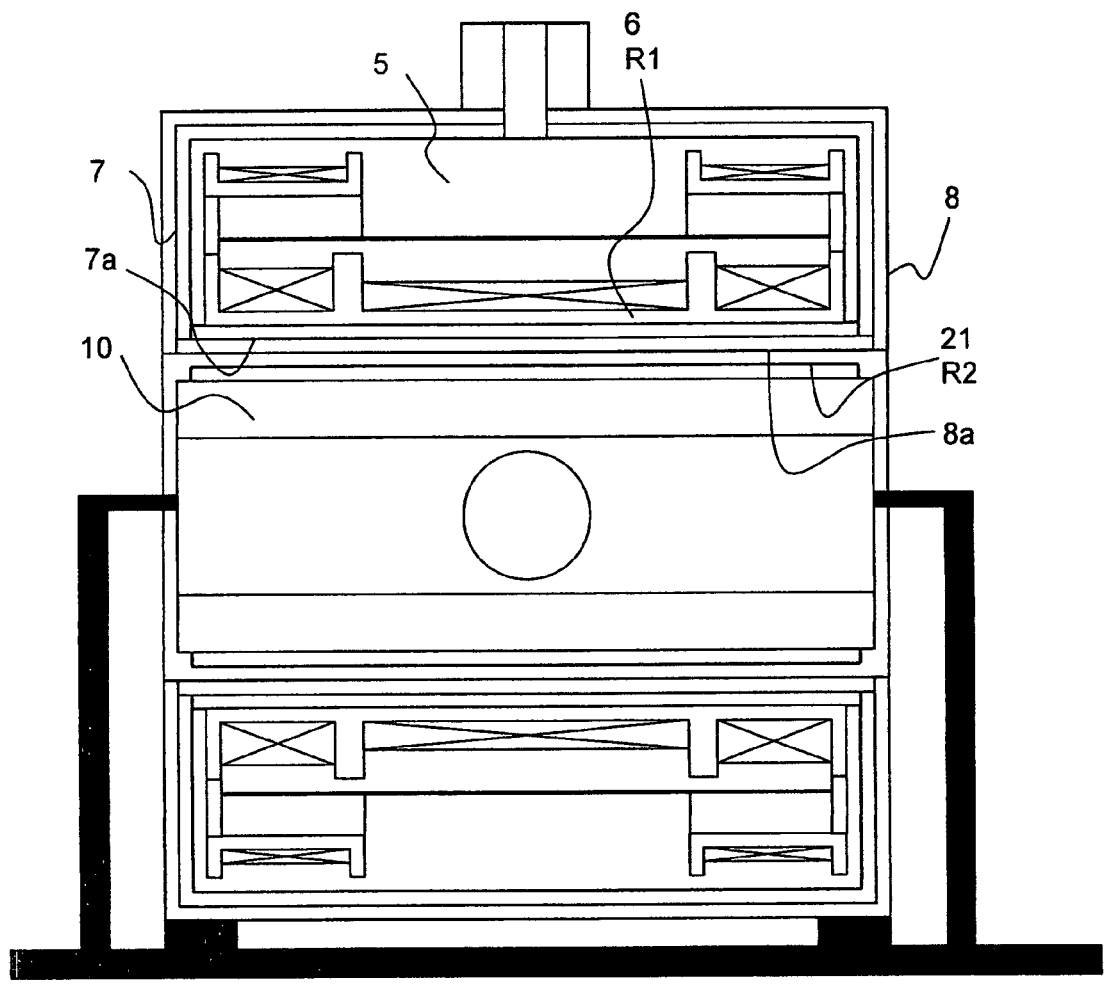
FIG. 2 shows an inventive superconducting magnet configuration with exactly one low temperature oscillation system which is formed by the inner tube of the helium tank, exactly one warm oscillation system which is formed by a tube in the room temperature bore, and with a slotted radiation shield.

FIG. 2 shows a further inventive superconducting magnet configuration which is similar to that of FIG. 1. The differences are explained below.

In the embodiment of FIG. 2, the radially inner wall 8a of the cryostat 8 is produced from a plastic material which is reinforced by glass fibers, and thus has a negligible conductivity (p=0). Instead, a nonmagnetic stainless steel tube 21 is located between the gradient system 10 and the cryostat inner wall 8a. The stainless steel tube 21 represents the only warm oscillation system R2 (at room temperature).

The stainless steel tube 21 being a warm oscillation system R2 has a radius of 0.46 m, a thickness of 2 mm and an electrical conductivity value of $p2=2.85 \times 10^3/ohm$. The characteristic mechanical value is q2=2.6*10$^7$ Nm/kg. The radiation shield 7, the inner wall 6 of the helium tank 5 (and thus the low temperature oscillation system R1) and tube 11 are designed like in FIG. 1.

Figure 3:
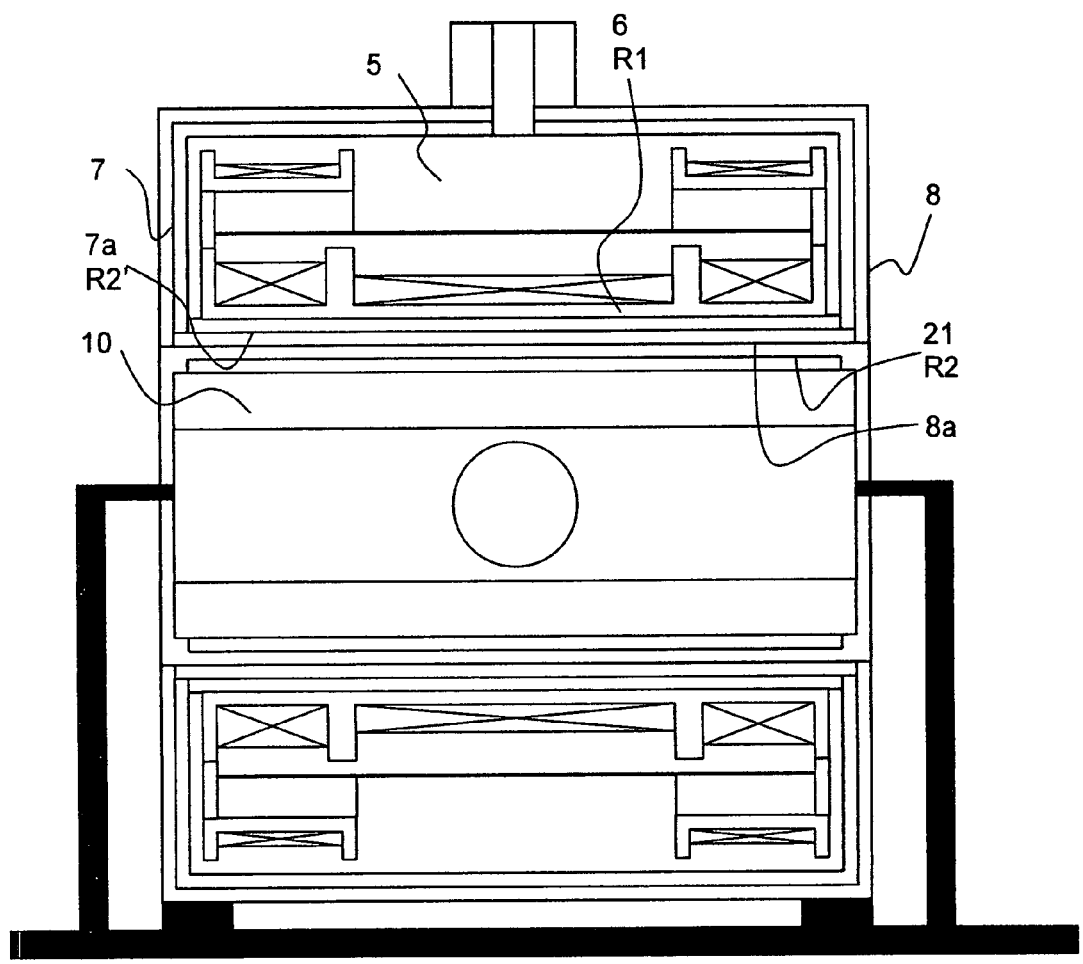
FIG. 3 shows an inventive superconducting magnet configuration which is similar to FIG. 2, with a radiation shield which is designed as a closed tube of AlMg3.

FIG. 3 shows a further inventive superconducting magnet configuration which is similar to FIG. 2. The differences are explained below.

The inner wall 6 of the helium tank 5 functions, as explained in FIG. 1, as a low temperature oscillation system R1. The tube 21 moreover forms the warm oscillation system R2 at room temperature.

The radially inner section 7a of the radiation shield 7 is tubular and closed in contrast to FIG. 2, and in particular not slotted. It is made from an AlMg$_3$ alloy. The section 7a thus represents a further warm oscillation system R2'. The section 7a has a radius of 0.485 m, a thickness of 4 mm and an electrical conductivity value of 1.7*10$^5$/ohm. The characteristic mechanical value is q2=2.5*10$^7$ Nm/kg.

Figure 4:
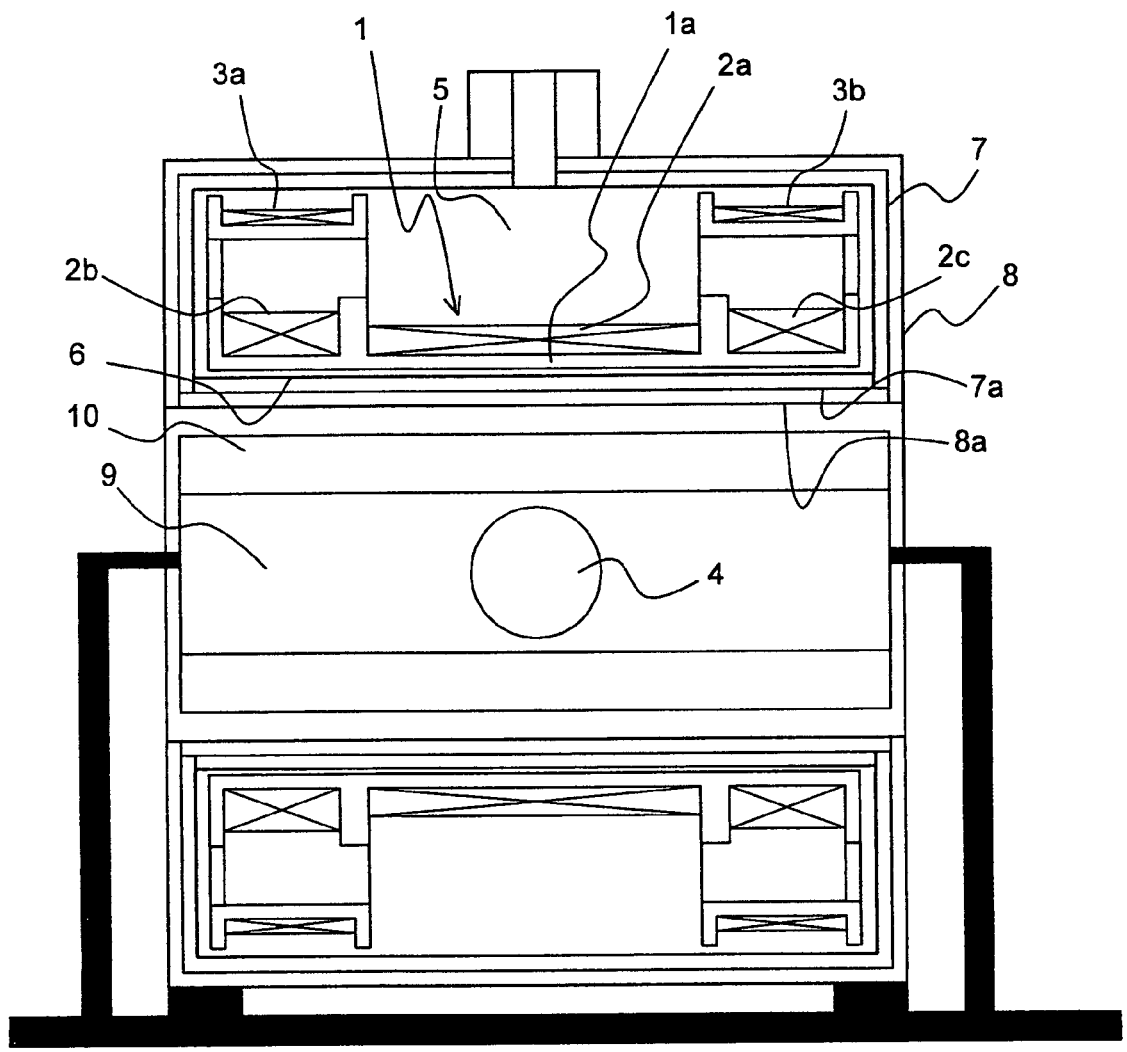
FIG. 4 shows a superconducting magnet configuration in accordance with prior art.

FIG. 4 shows a superconducting magnet configuration in accordance with prior art as represented e.g. by DE 101 27 822 A1.

The sections 2a, 2b, 2c of a main field section of a magnet coil 1 are wound onto a carrier body (coil body) 1a. The magnet coil 1 including carrier body 1a is disposed within a helium tank 5 of stainless steel. The helium tank 5 contains liquid and gaseous helium. The helium tank 5 is delimited in a radial inward direction by a separate inner wall 6. A radially inner closed tubular section 7a of a radiation shield 7 of copper shields the helium tank 5 from thermal radiation relative to the radially inner wall 8a of the cryostat 8 of nonmagnetic stainless steel. The gradient coil 10 and the working volume 4 are located within the room temperature bore 9. A homogeneous B field with a strength of 7 Tesla prevails in the working volume.

The oscillation systems in the configuration of FIG. 4 are:
the inner wall 8a of the cryostat 8, of nonmagnetic stainless steel with an inner radius of 0.47 m, thickness d=4 mm and electrical conductivity value p=5.7*10$^3$/ohm and characteristic mechanical value q=2.6*10$^7$ Nm/kg;
the section 7a of the radiation shield 7 of copper with a radius of 0.485 m, d=4 mm, p=1.2*10$^6$/ohm, q=1.35*10$^7$Nm/kg;
the inner tube 6 of the helium tank 5 of nonmagnetic stainless steel with an inner radius of 0.5 m, outer radius 0.506 m, d=6 mm, p=8.6*10$^3$/ohm;
the carrier body 1a of AlMg$_3$ with inner radius 0.508 m, outer radius 0.518 m, p=4.25*10$^5$/ohm, q=2.5*10$^7$ Nm/kg.

The SL wire of 80% copper and 20% Niobium titanium of the main field section is wound with an inner radius of 0.518 m and an outer radius of 0.608 m (and p=0).

In contrast to the invention, this prior art comprises, in particular, two low temperature oscillation systems (helium tank wall 6 and carrier body 1a) having poor electrical conducting properties.

FIG. 5 shows a schematic inclined view of a radiation shield 51 which is subdivided in the peripheral direction and can be used in accordance with the invention (e.g. as a section 7a of the radiation shield of FIG. 1 or FIG. 2).

The slotted radiation shield 51 has a tubular, electrically insulating carrier body 52. Numerous strands 53 are disposed on the carrier body 52, which are oriented in parallel in the axial direction. The strands 53 each consist of several (in the present case five) copper veins 54. In the right-hand part of FIG. 5, a strand 53 is shown on an enlarged scale. The strands 53 are not electrically connected.

The slotted radiation shield 51 permits axial heat transport but prevents eddy currents in the individual veins and thereby in the peripheral direction of the radiation shield 51.

FIG. 6a shows a diagram which represents the heating lines P_eddy in the embodiment of the invention of FIG. 1 as a function of the excitation frequency of the gradient coils. The curve 61 shows the heating line in the warm oscillation system R2, i.e. the cryostat inner wall. The curve 62 shows the heating power in the low temperature oscillation system R1, i.e. the inner wall of the helium tank. The heating power in the inner wall of the helium container is much smaller than the heating power in the cryostat wall.

The curve 62 (low temperature oscillation system R1) in FIG. 6b is shown on an enlarged scale. The maximum heating power is approximately 27 mW/m$^2$ at 2000 Hz.

FIG. 7 shows the heating power P_eddy in the low temperature oscillation system R1, i.e. the inner wall of the helium container, as a function of the frequency of the inventive embodiment of FIG. 2. The maximum heating power is approximately 16 mW/m$^2$ at 2100 Hz.

FIG. 8 shows the heating power P_eddy in the low temperature oscillation system R1, i.e. the inner wall of the helium container, as a function of the frequency of the inventive embodiment of FIG. 3. The maximum heating power is thereby approximately 35 mW/m$^2$ at 2100 Hz.

Figure 9:
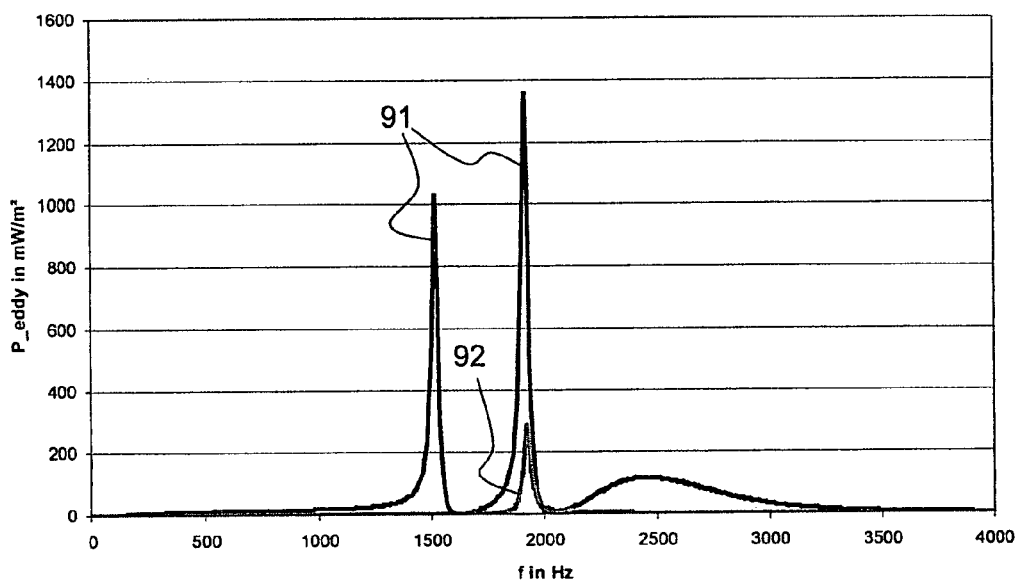
FIG. 9 shows a plot of the heating power in the inner tube of the helium container and in the coil body of FIG. 4.

FIG. 9 shows as a comparison the heating power P_eddy of conventional oscillation systems of the magnet configuration of FIG. 4, which are disposed in the low temperature area at 4.2 K. The excitation frequency of the gradient coils is shown towards the right. The curve 91 shows the behavior of the helium tank wall (reference numeral 6 in FIG. 4) of stainless steel, the curve 92 shows the behavior of the carrier body of AlMg$_3$ (reference numeral 1a in FIG. 4). The sum of the heating powers of the curves 91 and 92 determines the helium consumption in the configuration of FIG. 4. The maximum heating powers are approximately 1350 mW/m$^2$ at 1900 Hz in curve 91 and 300 mW/m$^2$ in curve 92. The heating powers of the conventional low temperature tubes are considerably higher than those of inventive configurations.

The diagrams of FIGS. 6a through 9 were calculated by a computer.

In a preferred embodiment of the inventive magnet configuration which is not shown, at least one flat configuration in accordance with DE 10354676 A1, claim 2, is non-positively mounted to a low temperature oscillation system R1, in particular the carrier tube of the magnet coil (low resistive shielding). The non-positive mounting may be effected e.g. through gluing or soldering on a surface of R1. The superconducting wires in the flat configuration considerably reduce the electric heating power generated in R1. Due to the non-positive mounting, the flat configuration exactly follows the vibrations of R1. Due to the improved electric conductivity, the eddy current associated with the vibrations of R1 flow almost exclusively in the flat configuration, where they considerably reduce the heating power due to the improved electric conductivity.

In summary, the invention concerns a magnet configuration comprising a superconducting magnet coil 1 within which a gradient system is to be switched. All low temperature oscillation systems R1 (with a temperature T1<10K) within the magnet coil 1 are produced from a material having good electrical conducting properties, and at least one warm oscillation system R2 (with a temperature T2>10K) within the magnet coil 1 has worse electrical conducting properties and has a considerably different mechanical resonance frequency (separation approximately 500 Hz or more) than at least one of the low temperature oscillation systems R1. This reduces the cooling power for the low temperature oscillation systems R1. In other words, the undesired heating power supplied to the low temperature oscillation systems due to mechanical oscillations and induced eddy currents, can be reduced.

I Claim:

1. A superconducting magnet configuration for a magnetic resonance apparatus, the configuration comprising:
a substantially cylindrical magnet coil having a magnet winding of superconducting wire for generating a magnetic field B in a working volume and defining a room temperature bore, which is coaxial relative to said magnet coil, and which contains said working volume; and
several electrically conducting oscillation systems, disposed radially inside said magnet winding, each of said oscillation systems having a uniform oscillation behavior and oscillating relative to each of other said oscillation systems, each oscillation system being substantially tubular and disposed coaxially to said room temperature bore, wherein each oscillation system has an electrical conductivity value $p=\sigma*d$ with $p>1*10^2$/Ohm at room temperature, with $\sigma$ being an electric conductivity of said oscillation system and d being a minimum wall thickness of said oscillation system in a radial direction, each oscillation system also having a characteristic mechanical value $q=E/\rho$, wherein E is an average modulus of elasticity of said oscillation system and $\rho$ is an average density of said oscillation system, wherein at least one of said oscillation systems is a low temperature oscillation system having an operation temperature of T<10K and at least one of said oscillation system is a warm oscillation system having an operation temperature of T2>10K, wherein all warm oscillation systems are disposed radially inside said at least one low temperature oscillation system, all low temperature oscillation systems having electrical conductivity values $p1=\sigma1*d1$ with $p1>1*10^6$/ohm at a respective temperature T1, wherein at least one warm oscillation system has an electrical conductivity value $p2=\sigma2*d2$ with $1*10^2$/ohm<$p2$<$1*10^6$/ohm at an associated temperature T2, wherein a characteristic mechanical value q2 of this at least one warm oscillation system differs from a characteristic mechanical value q1 of said at least one low temperature oscillation system by at least a factor of 1.5.

2. The superconducting magnet configuration of claim 1, wherein said characteristic mechanical value q2 of said at least one warm oscillation system differs from characteristic mechanical values q1 of all low temperature oscillation systems by at least a factor of 1.5.

3. The superconducting magnet configuration of claim 1, wherein all warm oscillation systems have an electrical conductivity value $p2=\sigma2*d2$ with $1*10^2$/ohm<$p2$<$1*10^5$/ohm at an associated temperature T2.

4. The superconducting magnet configuration of claim 1, wherein several low temperature oscillation systems are provided having characteristic mechanical values q1 which differ from each other by at least a factor of 1.5, wherein low temperature oscillation systems with higher characteristic mechanical values q1 are disposed further radially inward.

5. The superconducting magnet configuration of claim 1, wherein there is exactly one low temperature oscillation system.

6. The superconducting magnet configuration of claim 1, wherein there is exactly one warm oscillation system.

7. The superconducting magnet configuration of claim 1, wherein all low temperature oscillation systems are produced from copper, a copper alloy having $\sigma1>6*10^6$/(ohm m) at a temperature T1.

8. The superconducting magnet configuration of claim 1, wherein at least one warm oscillation system comprises non-magnetic stainless steel.

9. The superconducting magnet configuration of claim 1, wherein a low temperature oscillation system is formed by a carrier tube of said magnet coil.

10. The superconducting magnet configuration of claim 1, further comprising a helium tank for liquid helium in which said magnet coil is disposed.

11. The superconducting magnet configuration of claim 10, wherein a radially inner wall of said helium tank is produced from copper or a copper alloy.

12. The superconducting magnet configuration of claim 10, wherein a radially inner wall of said helium tank is connected to a carrier tube of said magnet coil in a non-positive fashion, said radially inner wall of said helium tank and said carrier tube forming a low temperature oscillation system.

13. The superconducting magnet configuration of claim 10, wherein a radially inner wall of said helium tank is formed as a carrier tube of said magnet coil, said radially inner wall of said helium tank forming a low temperature oscillation system.

14. The superconducting magnet configuration of claim 1, further comprising a cryostat, wherein an inner tube of an outer container of said cryostat forms a warm oscillation system.

15. The superconducting magnet configuration of claim 1, wherein a warm oscillation system is disposed within said room temperature bore between a gradient coil and means defining said room temperature bore.

16. The superconducting magnet configuration of claim 1, wherein at least one radiation shield is disposed between a low temperature oscillation system and a warm oscillation system, said radiation shield being cooled by liquid nitrogen or by a refrigerator.

17. The superconducting magnet configuration of claim 16, wherein said radiation shield is substantially tubular and produced from aluminium or an aluminium alloy.

18. The superconducting magnet configuration of claim 16, wherein said radiation shield is substantially tubular and subdivided several times in a peripheral direction thereof.

19. The superconducting magnet configuration of claim 1, wherein a gradient coil or an actively shielded gradient coil is disposed within said room temperature bore.

20. The superconducting magnet configuration of claim 19, wherein said gradient coil has a mounting which is independent of a warm oscillation system which is disposed next to it in a radially outward direction.

21. The superconducting magnet configuration of claim 1, wherein said at least one warm oscillation system is self-supporting in an axial direction over a length which corresponds to at least 80% of a length of said magnet coil.

22. The superconducting magnet configuration of claim 1, wherein said magnet coil comprises a main field section which is surrounded by a tube, said tube having an electrical conductivity value $p3>1*10^6$/ohm at a temperature T1<10K, wherein a shielding section of said magnet coil is disposed radially outside of said tube.

23. The superconducting magnet configuration of claim 1, wherein $1.5*q1<q2$.

24. The superconducting magnet configuration of claim 1, wherein at least one low temperature oscillation system has a mechanical resonance frequency of 1.5 kHz or less, and at least one warm oscillation system has a mechanical resonance frequency of 2.5 kHz or more.

25. The superconducting magnet configuration of claim 1, wherein a diameter D of said room temperature bore is D>0.4 m.

26. The superconducting magnet configuration of claim 1, wherein T2>20K.

27. The superconducting magnet configuration of claim 1, wherein a strength of a magnetic field in said working volume is at least 3 Tesla.

28. The superconducting magnet configuration of claim 1, wherein each oscillation system is formed as a tube.

* * * * *